US011462512B2

(12) United States Patent
Sikka et al.

(10) Patent No.: US 11,462,512 B2
(45) Date of Patent: *Oct. 4, 2022

(54) THREE-DIMENSIONAL MICROELECTRONIC PACKAGE WITH EMBEDDED COOLING CHANNELS (71) Applicant: International Business Machines Corporation, Armonk, NY (US)

(72) Inventors: Kamal K. Sikka, Poughkeepsie, NY (US); Fee Li Lie, Albany, NY (US); Kevin Winstel, East Greenbush, NY (US); Ravi K. Bonam, Albany, NY (US); Iqbal Rashid Saraf, Glenmont, NY (US); Dario Goldfarb, Dobbs Ferry, NY (US); Daniel Corliss, Waterford, NY (US); Dinesh Gupta, Hopewell Junction, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/135,474

(22) Filed: Dec. 28, 2020

(65) Prior Publication Data
US 2021/0118854 A1 Apr. 22, 2021

Related U.S. Application Data (63) Continuation of application No. 16/351,757, filed on Mar. 13, 2019, now Pat. No. 10,937,764.

(51) Int. Cl.
*H01L 25/065* (2006.01)
*H01L 23/48* (2006.01)
(Continued)

(52) U.S. Cl.
CPC .......... *H01L 25/0657* (2013.01); *H01L 23/46* (2013.01); *H01L 23/481* (2013.01);
(Continued)

(58) Field of Classification Search
CPC ... H01L 25/0657; H01L 23/46; H01L 23/481; H01L 23/5226; H01L 23/5383;
(Continued)

(56) References Cited

U.S. PATENT DOCUMENTS 5,111,278 A 5/1992 Eichelberger
5,309,318 A 5/1994 Beilstein, Jr. et al.
(Continued)

FOREIGN PATENT DOCUMENTS

CN 201490184 5/2010

OTHER PUBLICATIONS

List of IBM Patents or Patent Applications Treated as Related.
Non-Final Office Action received for U.S. Appl. No. 16/351,757 dated May 11, 2020, 73 pages.

*Primary Examiner* — Dao H Nguyen
(74) *Attorney, Agent, or Firm* — Amin, Turocy & Watson, LLP (57) ABSTRACT The subject disclosure relates to 3D microelectronic chip packages with embedded coolant channels. The disclosed 3D microelectronic chip packages provide a complete and practical mechanism for introducing cooling channels within the 3D chip stack while maintaining the electrical connection through the chip stack. According to an embodiment, a microelectronic package is provided that comprises a first silicon chip comprising first coolant channels interspersed between first thru-silicon-vias (TSVs). The microelectronic chip package further comprises a silicon cap attached to a first surface of the first silicon chip, the silicon cap comprising second TSVs that connect to the first TSVs.

(Continued)

A second silicon chip comprising second coolant channels can further be attached to the silicon cap via interconnects formed between a first surface of the second silicon chip and the silicon cap, wherein the interconnects connect to the second TSVs.

20 Claims, 9 Drawing Sheets

(51) Int. Cl.
*H01L 29/16* (2006.01)
*H01L 23/46* (2006.01)
*H01L 23/538* (2006.01)
*H01L 23/00* (2006.01)
*H01L 23/522* (2006.01)

(52) U.S. Cl.
CPC ...... *H01L 23/5226* (2013.01); *H01L 23/5383* (2013.01); *H01L 23/5386* (2013.01); *H01L 24/17* (2013.01); *H01L 29/16* (2013.01); *H01L 2224/02373* (2013.01); *H01L 2224/02381* (2013.01); *H01L 2924/3511* (2013.01)

(58) Field of Classification Search
CPC ... H01L 23/5386; H01L 23/473; H01L 24/17; H01L 29/16; H01L 2224/3511
USPC .......................................................... 257/712
See application file for complete search history.

(56) References Cited

U.S. PATENT DOCUMENTS

| | | | |
|---|---|---|---|
| 5,655,290 | A | 8/1997 | Moresco et al. |
| 7,936,563 | B2 | 5/2011 | Gosset et al. |
| 8,546,930 | B2 | 10/2013 | Bakir et al. |
| 8,921,992 | B2 | 12/2014 | Koontz et al. |
| 9,189,037 | B2 | 11/2015 | Brunschwiler et al. |
| 9,679,827 | B2 | 6/2017 | Vishkin |
| 10,504,819 | B2 * | 12/2019 | Gutala .................. H01L 23/467 |
| 10,937,764 | B2 * | 3/2021 | Sikka ...................... H01L 29/16 |
| 2009/0294954 | A1 | 12/2009 | Bakir et al. |
| 2012/0228779 | A1 | 9/2012 | King et al. |
| 2012/0306088 | A1 | 12/2012 | Bartley et al. |

* cited by examiner

THREE-DIMENSIONAL MICROELECTRONIC PACKAGE WITH EMBEDDED COOLING CHANNELS

TECHNICAL FIELD

This disclosure relates to three-dimensional (3D) microelectronic chip packages with embedded cooling channels.

BACKGROUND

Three-dimensional (3D) microelectronic chip packages (also referred to as 3D integrated circuits) wherein chips are stacked on top of each for better performance are becoming increasingly prevalent. 3D chip packages operate as a single unit to achieve enhanced performance at reduced power and with a smaller footprint than conventional two-dimensional integrated circuits (ICs). However, stacking causes an effective increase in power density since the cooling area is not changed. Additionally, the heat dissipated in the lower chip has to face additional thermal resistance as it conducts through the interconnects between the chips, back end of line (BEOL) layers in the chip and the silicon above the BEOL layers in the top chip. As a result, stacking leads to an increase in chip temperature.

Conduction mechanisms are sufficient to cool some 3D chip stacks that place a low-power chip, such as a memory chip, above or below a high-power chip, such as a processor chip (e.g., a central processing unit (CPU) or graphical processing unit (GPU)) chip) or an application specific integrated circuit (ASIC) chip. However, stacking two or more high-power chips can lead to a significant increase in temperature and conduction cooling becomes insufficient. The integration of cooling channels within the chip stack has been proposed as an alternative mechanism for cooling 3D chip stacks. However, practical implementation of introducing cooling channels into the chip stack while maintaining the electrical connection through the chip stack have yet to be achieved.

SUMMARY

The following presents a summary to provide a basic understanding of one or more embodiments of the invention. This summary is not intended to identify key or critical elements or delineate any scope of the different embodiments or any scope of the claims. Its sole purpose is to present concepts in a simplified form as a prelude to the more detailed description that is presented later. The subject disclosure is directed towards 3D microelectronic chip packages with embedded cooling channels. The disclosed 3D microelectronic chip packages provide a complete and practical mechanism for introducing cooling channels within the 3D chip stack while maintaining the electrical connection through the chip stack.

According to an embodiment, a microelectronic package is provided that comprises a first silicon chip comprising first coolant channels interspersed between first thru-silicon-vias (TSVs). The microelectronic chip package further comprises a silicon cap attached to a first surface of the first silicon chip, the silicon cap comprising second TSVs that connect to the first TSVs. A second silicon chip comprising second coolant channels can further be attached to the silicon cap via interconnects formed between a first surface of the second silicon chip and the silicon cap, wherein the interconnects connect to the second TSVs.

In one or more implementations, the microelectronic chip package can further comprise a first manifold formed within the first silicon chip that connects to the first coolant channels and a second manifold formed within the second silicon chip that connects to the second coolant channels. The silicon cap can further comprise first inlet and outlet holes located outside a perimeter of the first silicon chip, wherein the first inlet and outlet holes respectively connect to the first manifold and provide for introducing coolant fluid into the first coolant channels and removing the coolant fluid from the first coolant channels. Fluid couplings can connect to the inlet and outlet holes via a metal plate formed adjacent to the inlet and outlet holes with gaskets formed between the metal plate and the silicon cap.

In various implementations, the silicon cap is a first silicon cap and the microelectronic chip package further comprises a second silicon cap bonded to a second surface of the second silicon chip opposite the first surface of the second silicon cap, the second silicon cap enclosing the second coolant channels. With these implementations, the second silicon cap can comprise second inlet and outlet holes located outside a perimeter of the second silicon chip, wherein the second inlet and outlet holes respectively connect to the second manifold and provide for introducing coolant fluid into the second coolant channels and removing the coolant fluid from the second coolant channels. Fluid couplings can also connect to the second inlet and outlet holes via another metal plate formed adjacent to the second inlet and outlet holes with gaskets formed between the metal plate and the second silicon cap The inlet fluidic couplings can be connected to the inlet holes (in the first and second silicon caps) in parallel or in series, and the outlet fluidic couplings can also be connected to the outlet holes (in the first and second silicon caps) in parallel or in series. In some implementations, the second silicon chip further comprises TSVs interspersed between the second coolant channels and the second silicon cap can further comprise fourth TSVs that connect to the third TSVs.

The microelectronic chip package can also comprise a substrate, such as a ceramic or laminate substrate. For example, in some implementations, the substrate can include a build-up (of layers) of laminated dielectric films. The first silicon ship can be attached to the substrate via a second surface opposite the first surface of the silicon chip. In some implementations, a stiffener element or lid can be attached to a portion of the substrate around the first silicon chip. In various implementations, the first silicon chip can be attached to the substrate via second interconnects. The first silicon chip can further comprise redistribution layers located between the first TSVs and the second interconnects, wherein the redistribution layers respectively connect the second interconnects to the first TSVs.

In another embodiment, a microelectronic package is described that comprises silicon chips stacked on and electrically connected to one another, the silicon chips comprising coolant channels interspersed between first TSVs. The microelectronic package further comprises at least one capping layer formed between adjacent silicon chips of the stacked silicon chips, the capping layer comprising second TSVs that connect to the first TSVs of the adjacent silicon chips. In some implementations of this embodiment, the silicon chips comprise two stacked silicon chips. In other implementations, the silicon chips can comprise three of more stacked silicon chips. In one or more implementations, inlet holes and outlet holes can be respectively located outside a perimeter of the silicon chips, wherein the inlet holes and outlet holes respectively provide for flowing coolant fluid through the coolant channels. Inlet hose barbs can further connect to the inlet holes and outlet hose barbs can connect to the outlet holes, wherein the inlet hose barbs are connected to the inlet holes in parallel or in series, and wherein the outlet hose barbs are connected to the outlet holes in parallel or in series.

In one or more additional embodiments, another microelectronic package is provided comprising silicon chips stacked on and electrically connected to one another, wherein the silicon chips comprise coolant channels, and wherein at least one silicon chip of the silicon chips comprises first TSVs interspersed between a first set of the coolant channels formed within the at least one silicon chip. The microelectronic package further comprises capping layers formed on first surfaces of the silicon chips and enclosing the coolant channels, wherein at least one capping layer of the capping layers comprises second TSVs that connect to the first TSVs. The number of stacked silicon chips can include two or more silicon chips.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

The following detailed description is merely illustrative and is not intended to limit embodiments and/or application or uses of embodiments. Furthermore, there is no intention to be bound by any expressed or implied information presented in the preceding Summary section or in the Detailed Description section.

The subject disclosure is directed to 3D microelectronic chip packages with embedded cooling channels. The disclosed 3D microelectronic chip packages provide a complete and practical mechanism for introducing cooling channels within the 3D chip stack while maintaining the electrical connection through the chip stack (e.g., for the power and signal input/output). The subject 3D chips stacks can include two or more vertically stacked silicon chips. The two or more vertically stacked silicon chips can include low-power chips (e.g., memory chips), high-power chips (e.g., processor chips, CPU chips, GPU chips ASIC chips, and the like), or a combination thereof. Each (or in some implementations one or more) of the chips in the stack can include cooling (or coolant) channels formed within the silicon in a manner that separates/isolates the cooling channels from electrical circuitry of the chips. In various embodiments, the cooling channels integrated into the respective chips can be sealed with silicon caps that can take fluid couplings for routing the coolant into the channels. In addition, silicon caps provided on chips located immediately below another chip can include one or more thru-silicon vias (TSVs) that electrically connect the respective chips to one another. This structure of a bottom chip and an immediately higher chip can be repeated throughout the stack, wherein the coolant channels of the bottom chip(s) are isolated and capped to contain the coolant while the TSVs in the cap connect the bottom chip(s) to the immediately higher chip(s) in the stack. Accordingly, the disclosed techniques provide can be used to form chip stacks with three of more stacked chips. The disclosed 3D chip stacks further employ a unique manifolding scheme for introducing coolant fluid into the cooling channels via manifolds formed within the respective silicon chips together with a mechanism for connecting the fluidic couplings of the silicon caps to the manifolds.

One or more embodiments are now described with reference to the drawings, wherein like referenced numerals are used to refer to like elements throughout. It should be appreciated that the various structures depicted in the drawings (e.g., the respective layers, interconnectors, solders, chips, TSVs, channels, caps and other elements) are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements, such as, for example, integrated conducting, insulating or semiconductor layers, present between the first element and the second element. As used herein, terms such as upper, lower, above, below, directly above, directly below, aligned with, adjacent to, right, left, vertical, horizontal, top, bottom, and derivatives thereof shall relate to the disclosed structures as oriented in the drawing figures.

Figure 1:
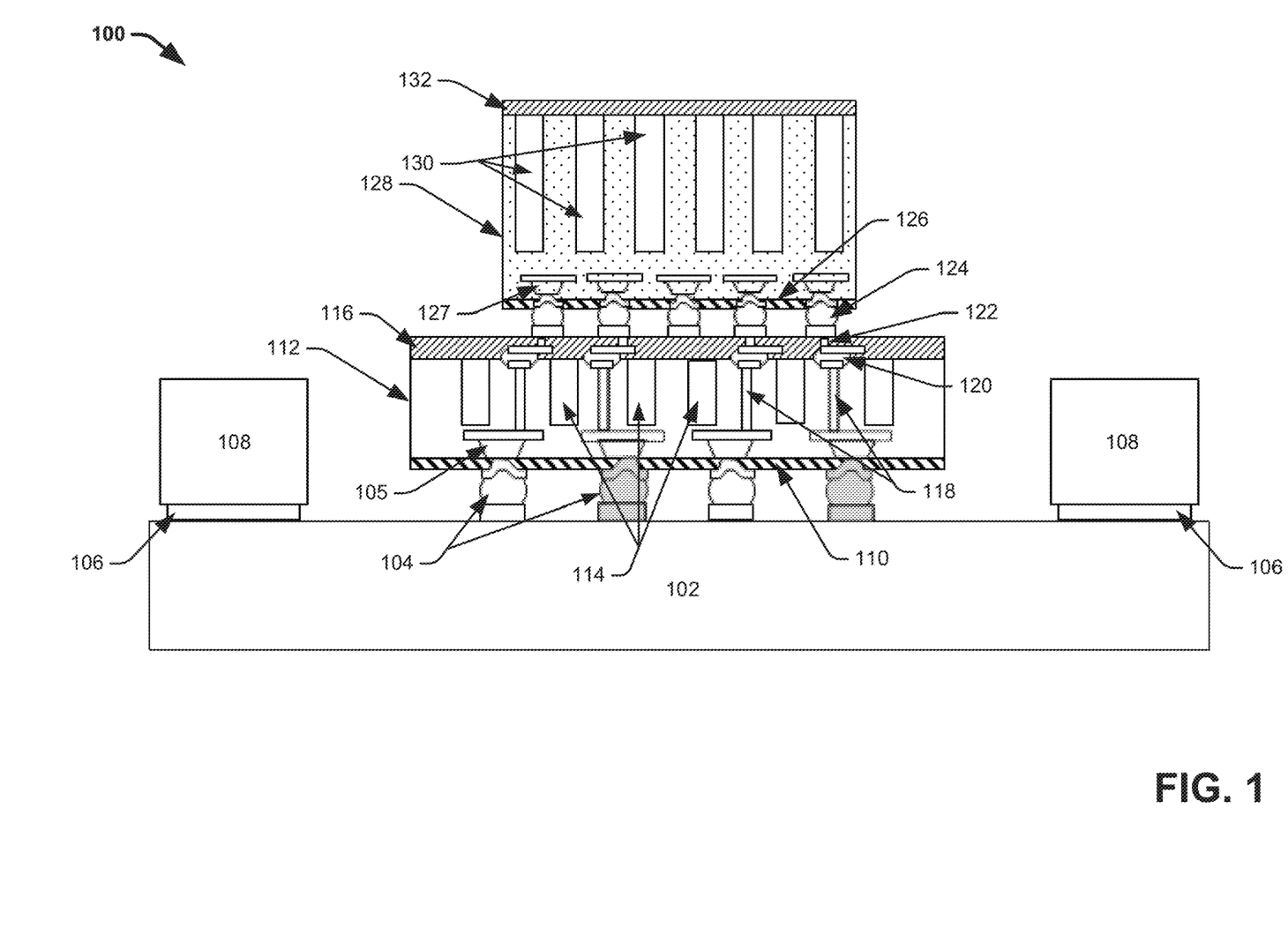
FIG. 1 presents a cross-sectional view of an example three-dimensional (3D) microelectronic chip package in accordance with embodiments described herein.

Turning now to the drawings, FIG. 1 presents a cross-sectional view of an example 3D microelectronic chip package 100 in accordance with embodiments described herein. In the embodiment shown, the 3D microelectronic chip package 100 comprises two chips stacked vertically above/below one another, chip 112 and chip 128. In various embodiments, chip 112 is referred to herein as the bottom chip and chip 128 is referred to as the top chip. As used herein, the term "chip" can refer to a silicon chip, a silicon wafer, a semiconductor chip/wafer, an integrated circuit chip, a transistor or the like. In various embodiments, chip 112 and chip 128 are silicon chips. Chip 112, chip 128 and other chips described herein can be or include low power chips (e.g., memory chips), high power chips (e.g., CPU chips, GPU chips, ASIC chips, etc.), or a combination thereof.

The respective chips of the 3D microelectronic chip package include cooling channels formed therein. For example, chip 128 comprises cooling channels 130 and chip 112 comprises cooling channels 114. The number and dimensions (e.g., width and depth) of the cooling channels 130 and/or cooling channels 114 can vary. The cooling channels (e.g., cooling channels 130 and cooling channels 114) can be configured to receive and facilitate the flow of coolant fluid through the respective chips in association with electrical operation of the 3D microelectronic chip package 100 to cool the respective chips.

Various elements depicted in the FIG. 1 and additional drawings described herein comprise a plurality of the same element. To reduce the complexity of the drawings, only one or a few of the same element are identified in the drawings with a single reference numeral/arrow pointing thereto. However, it should be appreciated that each corresponding element without a reference numeral/arrow pointing thereto represents the same element. For example, in the embodiment shown, chip 128 is depicted with six cooling channels 130, yet only three of the cooling channels 130 are explicitly shown with a reference numeral/arrow pointing thereto.

In one or more embodiments, the cooling channels (e.g., cooling channels 130 and cooling channels 114) can be etched into the chips (e.g., chip 112 using a suitable semiconductor fabrication etching technique (e.g., wet etching, plasma etching, photolithography, etc.). For example, the cooling channels can be etched through first surfaces (e.g., top surfaces) of the respective chips and into the thickness of the respective chips to a suitable depth. In various implementations, after etching, the cooling channels can be exposed at the first surfaces of the respective chips. The cooling channels are then sealed via respective caps formed on the first services of the silicon chips. For example, chip 112 includes cap 116 formed on the first surface of the chip 112. The cap 116 encloses or seals cooling channels 114. Likewise, chip 128 includes a cap 132 formed on the first surface of chip 128. The cap 132 encloses or seals the cooling channels 130. In various embodiments, the caps (e.g., cap 116 and cap 132) can be formed with a semiconductor material. For example, in one or more embodiments, the respective caps (e.g., cap 116 and cap 132) can be formed with silicon. The respective caps can be adhered to the first surfaces of the respective chips using a suitable bonding mechanism. For example, the bonding mechanism can include fusion bonding, solder bonding or the like.

The 3D microelectronic chip package 100 can further include one or more inlet holes (not shown) and one or more outlet holes (not shown) that are fluidically coupled to the cooling channels and provide for flowing coolant fluid into and out of the respective cooling channels. In various implementations, each chip of the chip stack including cooling channels (e.g., chip 112 with cooling channels 114, chip 128 with cooling channels 130) can include one or more inlet holes and one or more outlet holes. The location and shape of the inlet and outlet holes can vary.

For example, in various embodiments, the chips of the chip stack (e.g., chip 112, chip 128 and the like) can respectively comprise manifolds (not shown) formed therein (e.g., within the thickness of the silicon) that connect to the cooling channels. For instance, in one or more embodiments, chips (e.g., chip 112, chip 128 and the like) can have a square or rectangular prism geometry with four sides, a top surface (to which the cap 116 and cap 128 is bonded) and a bottom surface. In accordance with this example, the cooling channels (e.g., cooling channels 114, cooling channels 130 and the like) formed within a chip (e.g., chip 112, chip 128) can extend through the length of the chip from a first side of the chip to a second side of the chip opposite the first side. A manifold can further be formed within the chip on opposite sides of the cooling channels. For example, a first manifold can be formed within the chip at the first side of the chip and a second manifold can formed within the chip at the second side of the chip. The cooling channels can further extend or branch from the first manifold to the second manifold. The first manifold and the second manifold can respectively be sealed by the cap (e.g., cap 116, cap 132 and the like).

In some implementations of these embodiments, the inlet and/or outlet holes can be formed through the respective caps (e.g., cap 116 and cap 132) that enclose the cooling channels. The location of the inlet and/or outlet holes within the caps can vary and be formed at any location in the cap that aligns with the cooling channels and/or the manifolds (e.g., at or near the center of the chip, at or near a perimeter of the chip, or the like). For example, in one implementation, one or more inlet holes can be formed through a first portion of the cap (e.g., cap 116, cap 132 and the like) formed directly above the first manifold and fluidically connect to the first manifold. Likewise, one or more outlet holes can be formed through a second portion of the cap formed directly above the second manifold and fluidically connect to the second manifold. Coolant fluid can further be introduced into the first manifold through the one or more inlet holes and flow through the cooling channels into the second manifold on the opposite side of the chip. The coolant fluid can further flow out of the chip via the one or more outlet holes in the cap 116 that are fluidically coupled to the second manifold. In other implementations of these embodiments, the inlet and/or outlet holes can be formed through portions of the chips that connect to the manifolds (e.g., as opposed to through the cap). For example, one or more inlet holes can be formed through the first side or sidewall of the chip and connect to the first manifold and one or more outlet holes can be formed through the second side or sidewall of the chip and connect to the second manifold. In another example, the one or more inlet holes and/or outlet holes can be formed through a bottom surface of the chip (e.g., the surfaces of chip 112 and chip 128 opposite the surfaces to which the respective caps 116 and 132 are attached) at any location that aligns with the cooling channels and/or the manifolds.

The 3D microelectronic chip package 100 can further include a substrate 102 (or chip carrier) upon which the chip stack is mounted. For example, in the in embodiment shown, chip 112 is attached (e.g., bonded) to substrate 102 via a second surface or back surface of the chip 112 opposite the first surface of the chip 112 to which the cap 116 is attached.

The chip 112 can be attached to the substrate 102 via one or more interconnects 104. The one or more interconnects can include solder bumps, copper pillars, or the like. For example, in various implementations, the bottom chip (chip 112) can be mounted on the substrate 102 using a controlled collapse chip connection mechanism, (also referred to flip chip or C4). The substrate 102 can be formed out of a suitable chip carrier/packaging material, including but not limited to, laminate, ceramic, glass plastic or the like. In some implementations, the substrate 102 can include one or more laminated dielectric films or layers. A stiffener element 108 can also be attached to the substrate 102 to strengthen and reduce warpage of the 3D microelectronic chip package 100. For example, the stiffener element 108 can comprise stainless steel, copper, invar, and the like. The stiffener element 108 can be attached to the substrate via an adhesive, solder, or another suitable bonding material 106.

In addition to the cooling channels 114, the bottom chip (chip 112) further includes TSVs 118 interspersed between the cooling channels 114. The number of TSVs can vary. The TSVs 118 and other TSVs described herein are vertical electrical connections that pass through the silicon and provide for electrically connecting the chip 112 to another chip stacked thereon (e.g., chip 128). TSVs replace edge wiring by creating vertical connections through the body of the chips. The resulting package thus has no added length or width. Because no interposer is required, a TSV 3D package can also be flatter than an edge-wired 3D package. This TSV technique is sometimes also referred to as through-silicon stacking (TSS) or thru-silicon stacking (TSS). The TSVs 118 (and other TSVs described herein) can be formed within silicon using standard TSV processing techniques (e.g., front-end-of-line processing (FEOL) and/or BEOL). In some embodiments, each of the TSVs 118 (or in some implementations, one or more of the TSVs 118) can connect to a redistribution layer 105 formed at the bottom of the chip 112 (e.g., between the base of the cooling channels 114 and the second surface or back surface of the chip opposite the first surface of the chip to which the cap 116 is attached). In one or more embodiments, the redistribution layers 105 can connect to the interconnects 104.

Chip 112 can also include a passivation layer 110 formed on the bottom or second surface of the chip 112. The top chip, chip 128, can similarly include a passivation layer 126 formed on a back surface or second surface of the chip 128 opposite the first surface to which the cap 132 is attached. Passivation layer 110 and passivation layer 126 can include a suitable insulating material, including but not limited to: silicon oxide, silicon dioxide, silicon nitride, silicon oxynitride, aluminum oxide, hafnium oxide, zirconia, titanium oxide, zirconium silicate, zirconium aluminate, gadolinium silicate, titanium silicate, graphene oxide, polyimide, polyester, polyethylene terephthalate, polyethylene naphthalate, polyether-ether-ketone, Polydimethylsiloxane The 3D microelectronic chip package 100 further includes a unique mechanism to electrically couple two or more stacked chips to one another. In particular, for bottom chips included in a 3D chip package upon which another chip is mounted directly thereon, (which in this case is chip 112), the cap of the bottom chip can also include integrated TSVs. The integrated TSVs in the cap can electrically connect to the TSVs of the bottom chip and the electrical circuitry of the top chip stacked thereon. For example, in the embodiment shown, cap 116 can include integrated TSVs 122. The integrated TSVs 122 can respectively connect to TSVs 118 via a solder 120 or another suitable electrically conductive bonding material/mechanism. To electrically couple chip 128 to chip 112, chip 128 can be bonded to the a top/first surface of the cap 116 using one or more interconnects 124. The interconnects 124 can include but are not limited to, solders, C4 solders, micro C4 solders, copper pillars or the like. The one or more interconnects 124 that bond chip 112 to chip 128 can be formed adjacent to and/or contacting the one or more integrated TSVs 122 of the cap 116. In various embodiments, each (or in some implementations one or more) of the one or more interconnects 124 can connect to a redistribution layer 127 formed at the bottom of the chip 128 (e.g., between the base of the cooling channels 130 and the second surface or back surface of the chip 128 opposite the first surface of the chip to which the cap 132 is attached).

In the embodiment shown, because the top chip does not include another chip stacked thereon, the top chip does not need to include TSV formed therein. Likewise, the cap 132 of the top chip (chip 112) does not need integrated TSVs formed therein (e.g., the top chip can include only the cooling channels and the IC electrical components). The 3D microelectronic chip package only includes two stacked chips, a bottom chip (chip 112) and a top chip (chip 128). However, the structure of 3D microelectronic chip package 100 can be extended to include more than two stacked chips. In particular, the structure of the bottom chip, chip 112, and the associated cap and interconnect structure for connecting the bottom chip to another chip stacked thereon can be repeated for any number of chips in stack (e.g., three, four, ten, etc.).

Figure 2:
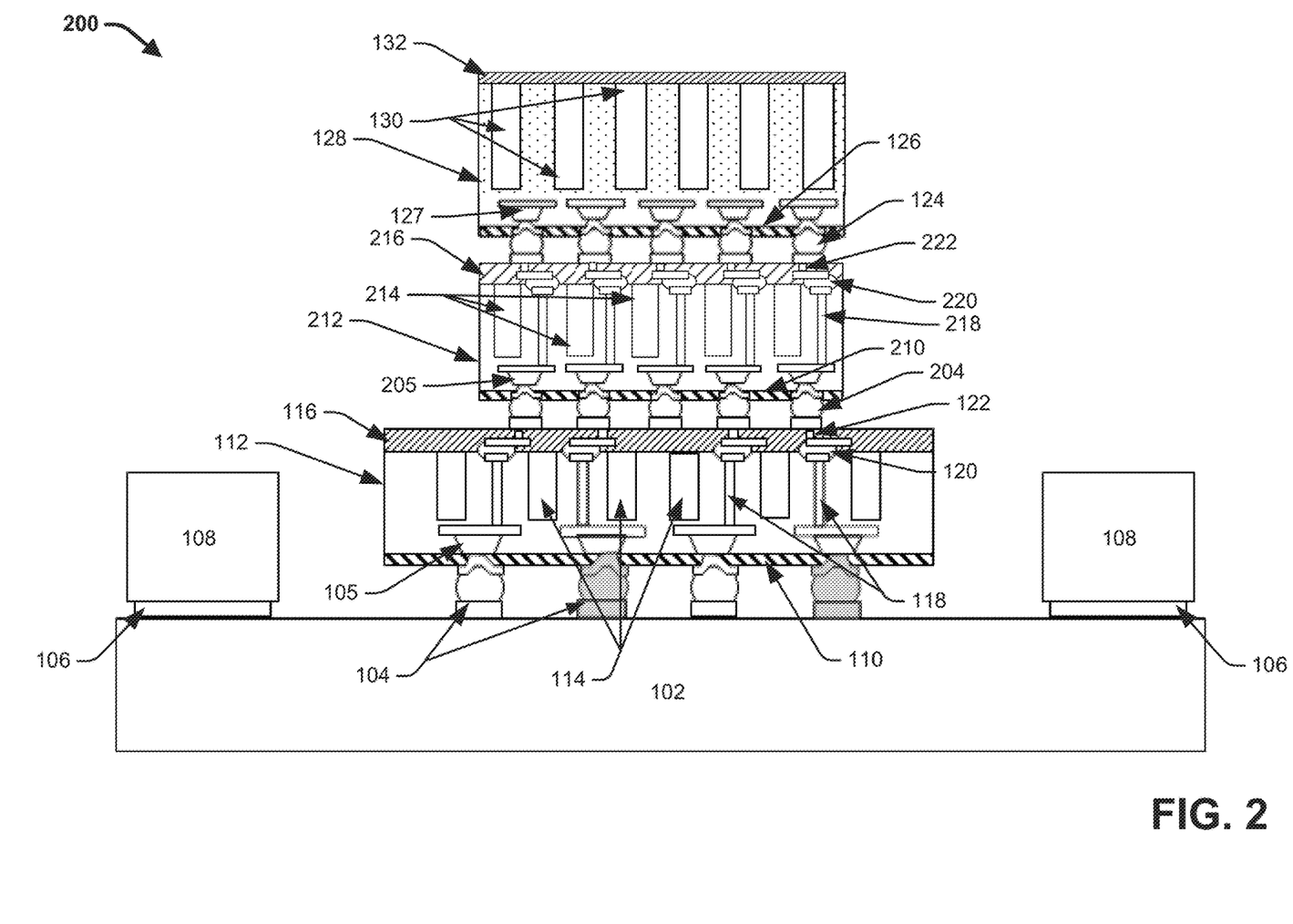
FIG. 2 presents a cross-sectional view of another example 3D microelectronic chip package in accordance with embodiments described herein.

For example, FIG. 2 presents a cross-sectional view of another example 3D microelectronic chip package 200 including more than two stacked chips in accordance with embodiments described herein. The 3D microelectronic chip package 200 includes same or similar features and functionalities as 3D microelectronic chip package 100 with the addition of a third chip, chip 212 formed between chip 128 and chip 112. Repetitive description of like elements employed in respective embodiments is omitted for sake of brevity.

Chip 212 can include same or similar features and functionalities as chip 112. For example, chip 212 can include a plurality of cooling channels 214 interspersed between one or more TSVs 218. In the embodiment shown, chip 212 is bound to a top/first surface of cap 116 via one or more interconnects 204 (e.g., solders, C4 solders, micro C4 solders, copper pillars, etc.). The one or more interconnects 204 are formed adjacent to and/or contacting the one or more integrated TSVs of the cap 116. The one or more interconnects 204 can respectively connect to the one or more TSVs 118 of chip 212 via respective redistribution layers 205 formed at the back or bottom surface of the chip 212. Chip 212 further includes a cap 216 formed on the top surface of the chip 212 opposite the back surface of the chip 212. The cap 216 can enclose and/or seal the cooling channels 214. The cap 216 can also include the inlet/outlet holes that fluidically couple to the cooling channels 214 via a manifold (not shown) formed within the chip 212, as described with reference to chip 112. Like cap 116, cap 216 can include integrated TSVs 222 that respectively connect to the TSVs 218 of the chip 212 via one or more solders 220. The top chip, (chip 128), can further be bonded to chip 212 via one or more interconnects 124. Chip 212 can also include a passivation layer 210 formed at the bottom surface thereof, (e.g., the surface opposite the cap 216).

The structure of chip 212, cap 216 and associated interconnect structure for connecting chip 212 to chip 112 and chip 128 can be repeated numerous times to facilitate stacking any number of chips. For example, in one or more embodiments, the structure of 3D microelectronic chip package 200 can include a bottom chip attached to a substrate corresponding to chip 112, a top chip formed on the bottom chip corresponding to chip 128, and any number of intermediary chips formed between the bottom chip and the top chip, wherein the intermediary chips correspond to chip 212. In this regard, regardless of the number of chips included in a 3D microelectronic chip package described herein (e.g., 3D microelectronic chip package 100, 3D microelectronic chip package 200, and the like), the chip stack can include a plurality (e.g., two or more) of silicon chips stacked on and electrically connected to one another, wherein each (or in some implementations one or more) of the silicon chips comprise embedded coolant/cooling channels (e.g., cooling channels 114, cooling channels 214, cooling channels 130 and the like), and wherein at least one silicon chip (e.g., the bottom chip having the structure of chip 112 and/or one or more intermediary chips having the structure of chip 212) of the plurality of silicon chips comprises TSVs (e.g., TSVs 118, TSVs 218 and the like) interspersed between the coolant/cooling channels formed therein. The microelectronic package further comprises capping layers (e.g., cap 132, cap 216, cap 116 and the like) formed on first surfaces of the respective silicon chips of the stack, wherein the capping layers respectively enclose the coolant channels, and wherein at least one capping layer (e.g., cap 116, cap 216 and the like) of the capping layers comprises second TSVs (e.g., integrated TSVs 122, integrated TSVs 222, and the like) that connect to the first TSVs.

Figure 3:
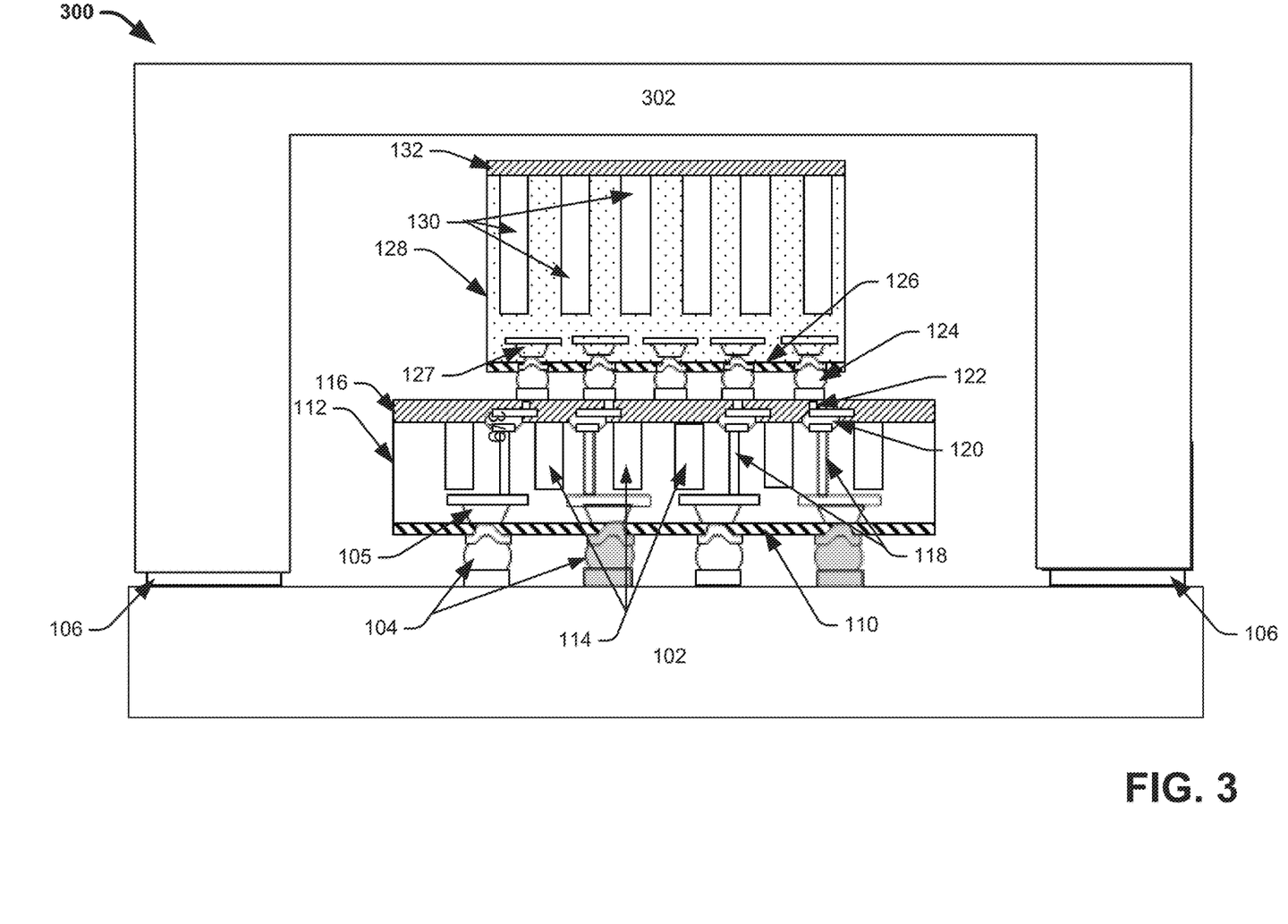
FIG. 3 presents a cross-sectional view of another example 3D microelectronic chip package in accordance with embodiments described herein.

FIG. 3 presents a cross-sectional view of another example 3D microelectronic chip package 300 in accordance with embodiments described herein. Repetitive description of like elements employed in respective embodiments is omitted for sake of brevity.

In the embodiments shown in FIGS. 1 and 2, the 3D microelectronic chip packages included a stiffener element 108 formed on the substrate 102 to increase the strength of the substrate an minimize warpage of the substrate. In other embodiments, in addition to and/or alternative to the stiffener element 108, the 3D microelectronic chip package can include a lid 302. For example, the lid 302 can attach to the substrate 102 via a suitable bonding material 106 and enclose or partially enclose the chip stack. The lid 302 can comprise laminate, plastic, ceramic, glass, or another suitable material.

Figure 4:
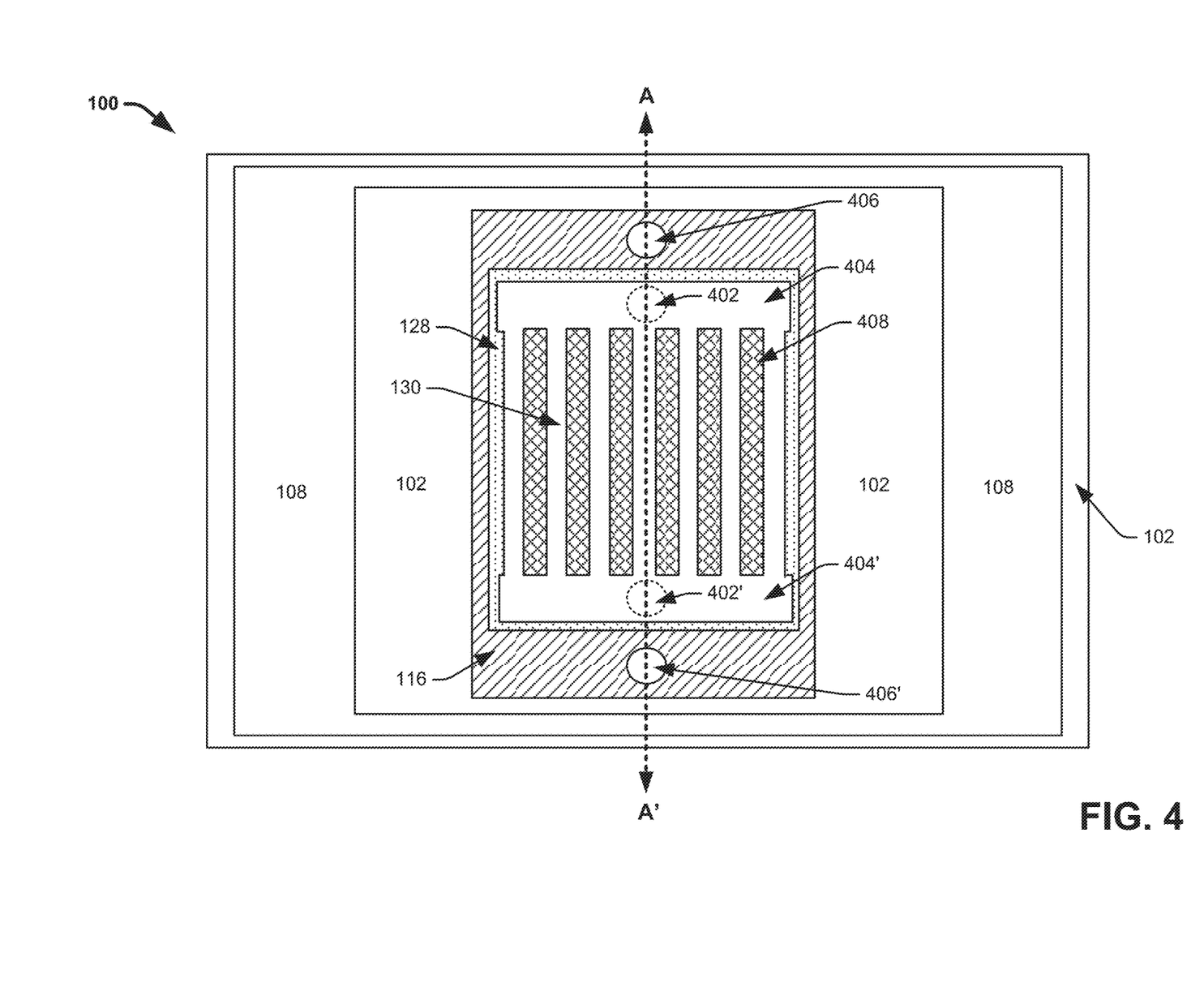
FIG. 4 presents a top view of a portion of a 3D microelectronic chip package with the top cap removed in accordance with embodiments described herein.

FIG. 4 presents a top view of a portion of 3D microelectronic chip package 100 with the top cap removed in accordance with embodiments described herein. Repetitive description of like elements employed in respective embodiments is omitted for sake of brevity.

With reference to FIG. 4 in view of FIG. 1, in the embodiment shown in FIG. 4, presented is a top down view of the top surface of the chip 128 with cap 132 removed. Chip 128 is formed on or over the cap 116 of the bottom chip (chip 112, not visible). The (top) chip 128 is depicted smaller in size than the (bottom) chip 112 upon which cap 116 is formed. However, the size of the chips can vary. For example, in some implementations, the top chip can be larger than the smaller chip, or the chips can be the same size. The cooling channels 130 respectively connect to manifolds formed on opposite sides of the chip 128, manifold 404 and manifold 404', respectively. The dashed circles shown in the respective manifolds indicate the relative locations of an inlet hole 402 and an outlet hole 402' that connect to the respective manifolds. For example, in one or more embodiments, the inlet hole 402 and the outlet hole 402' can be formed in the cap 132 which is removed in the current view. The inlet hole 402 and the outlet hole 402' can be formed at or near a perimeter of the chip 128. For example, the inlet hole 402 and the outlet hole 402' can be formed at or near an area of the chip around/outside of the cooling channels 130. The top surface of the bottom cap (cap 116) shows an inlet hole 406 and an outlet hole 406' formed therein. The inlet hole 406 and outlet hole 406' can respectively connect to the cooling channels of formed in the bottom chip (chip 112). These inlet and outlet holes can also be formed at or near a perimeter of the bottom chip. The chip 128 can include fins 408 formed between the cooling channels 130 to isolate/separate the cooling channels.

Figure 5:
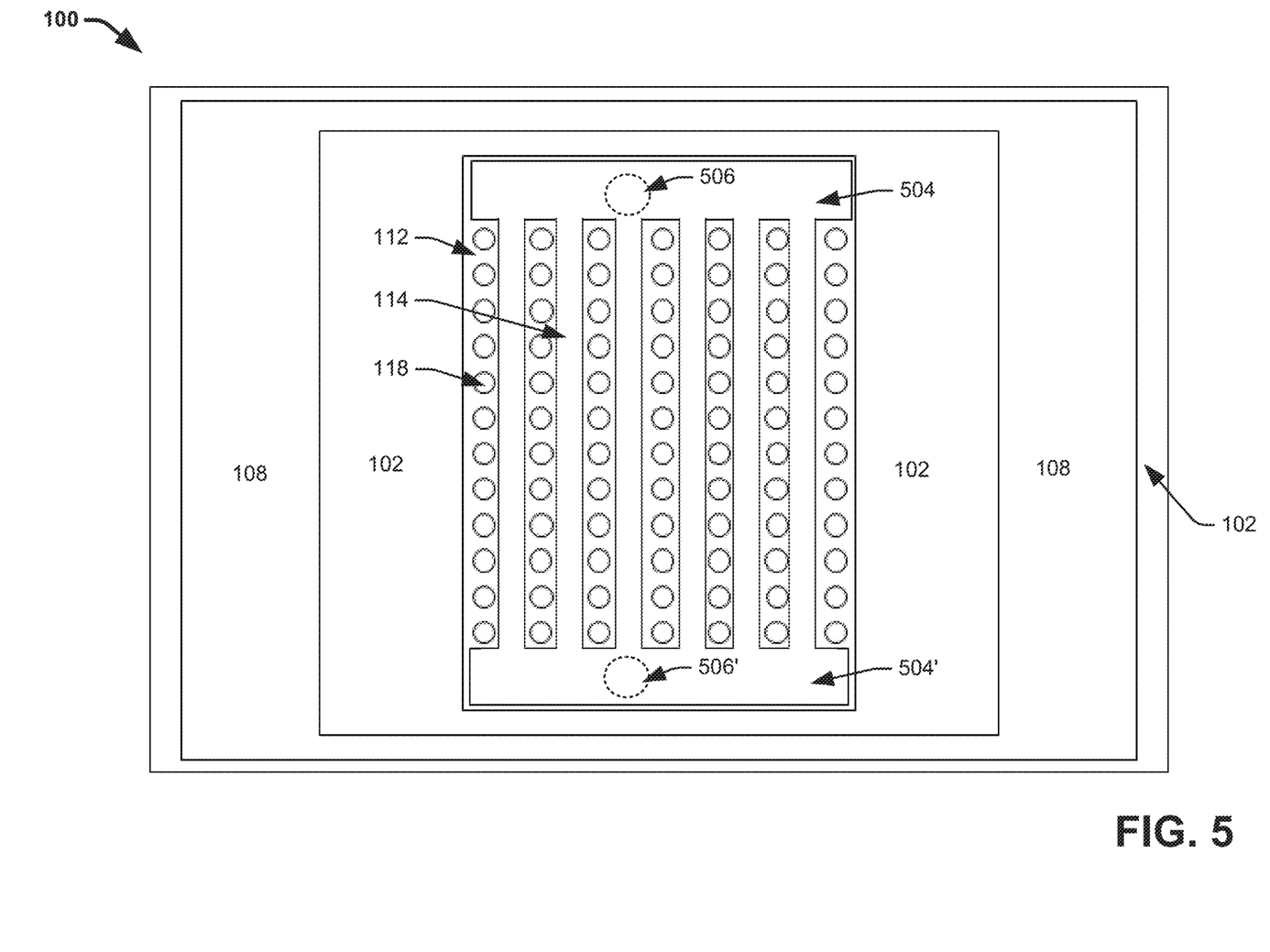
FIG. 5 presents a top view of a portion of a 3D microelectronic chip package with the bottom cap removed in accordance with embodiments described herein.

FIG. 5 presents a top view of a portion of the 3D microelectronic chip package 100 with the bottom cap removed in accordance with embodiments described herein. Repetitive description of like elements employed in respective embodiments is omitted for sake of brevity.

With reference to FIG. 5 in view of FIGS. 1 and 4, in the embodiment shown in FIG. 5, presented is a top down view of the top surface of the chip 112 cap 116 and elements formed thereon (e.g., chip 128, cap 132, etc.) removed. Chip 112 is formed on or over substrate 102. The chip 112 includes rows of TSVs 118 interspersed between cooling channels 114. The cooling channels respectively connect to manifolds formed on opposite sides of the chip 112, manifold 504 and manifold 504', respectively. The dashed circles 506 and 506' respectively indicate the relative locations of inlet hole 406 and outlet hole 406' formed in the cap 116 (now removed) that connect to the respective manifolds. The inlet hole 406 and outlet hole 406' can respectively connect to the cooling channels 114. These inlet and outlet holes can also be formed at or near a perimeter of the bottom chip (chip 112).

Figure 6:
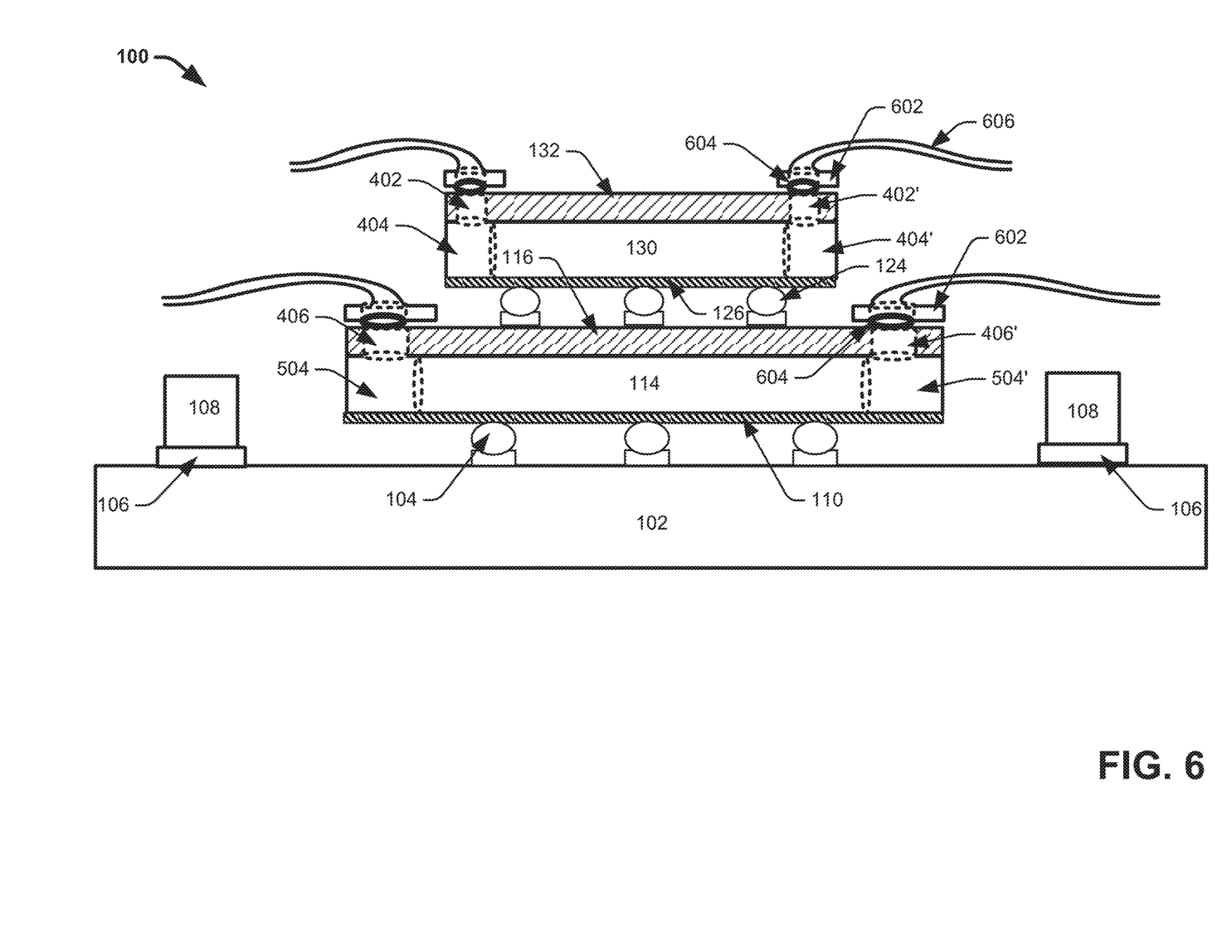
FIG. 6 presents another cross-sectional view of an example 3D microelectronic chip package in accordance with embodiments described herein.

FIG. 6 presents another cross-sectional view of example 3D microelectronic chip package 100 in accordance with embodiments described herein. Repetitive description of like elements employed in respective embodiments is omitted for sake of brevity.

With reference to FIG. 6 in view of FIGS. 1, 4 and 5 in the embodiment shown in FIG. 5, presented is a cross-sectional view of 3D microelectronic chip package 100 taken along axis A-A' shown in FIG. 4. In this regard, the cross-sectional view shown in FIG. 6 cuts the 3D microelectronic chip package 100 in half along the length of a central cooling channel of cooling channels 130 and a central cooling channel of cooling channels 114. FIG. 6 presents the internal fluidic path for flowing coolant into an out of the cooling channels. As shown in FIG. 6, in various embodiments, microfluidic tubes 606 (or hoses, capillaries etc.) can be connected to respective inlet holes (e.g., inlet hole 402 and inlet hole 406) and outlet holes (e.g., outlet hole 402' and outlet hole 406') in the respective caps (cap 132 and cap 116) of the chips (e.g., chip 112 and chip 128). The inlet holes can feed coolant into the respective inlet manifolds (e.g., manifold 404 and manifold 504) in the chips which can open into the respective cooling channels (e.g., cooling channel 130 and cooling channel 114). The coolant fluid can flow into the respective outlet manifolds (e.g., manifold 404' and manifold 504') and out of the chip via the respective outlet holes and connected microfluidic tubes.

In some embodiments, the inlet and outlet holes formed in the respective caps can include fluidic couplings such as hose bards or another fluidic connector to facilitate connecting the microfluidic tubes 606 thereto. For example, in the embodiment shown, a connector plate 602 can be formed on the respective caps (cap 132 and cap 116) around the inlet an outlet holes. For instance, connector plates can be formed around the periphery of the respective caps (e.g., cap 132 and cap 116). In various embodiments, the connector plate 602 can comprise a metal plate with openings cut out of the metal plate at locations corresponding to the inlet and outlet holes (e.g., inlet hole 402 and 406 and outlet hole 402' and 406'). Hose barbs (or another fluidic coupling) can connect to the holes in the connector plate 602 and the microfluidic tubes 606 can connect to the hose barbs. A viton layer 604 (e.g., an o-ring, a gasket, etc.) can be formed in between the hose barbs (or other type of fluidic coupling) and the metal plate. The inlet and outlet hose barbs can be connected in parallel or in series.

In accordance with the embodiments shown in FIGS. 4, 5 and 6 the inlet and outlet holes (e.g., inlet holes 402 and 406 and outlet holes 402' and 406') formed through the caps (e.g., cap 116 and cap 132) at locations at or near the perimeters of the chips that align with the manifolds. The inlet and outlet holes are also shown as having a circular shape. However, the location and shape of the inlet and outlet holes can vary. For example, the inlet and/or outlet holes can be slits or have a rectangular shape. The inlet and/or outlet holes can also be formed through the caps (e.g., cap 116 and cap 132) at any location that aligns with the cooling channels (e.g., cooling channels 114, cooling channels 130, and the like) and/or the manifolds (e.g., manifolds 404 and 404', manifolds 505 and 504' and the like). In other embodiments, the inlet and/or outlet holes can be formed through portions of the chips that connect to the manifolds (e.g., as opposed to through the cap). For example, one or more inlet holes can be formed through a first sidewall of the chip that connects to the inlet manifold and one or more outlet holes can be formed through a second sidewall of the chip and connect to the outlet manifold. In another example, the one or more inlet holes and/or outlet holes can be formed through a bottom surface of the chip (e.g., the surfaces of chip 112 and chip 128 opposite the surfaces to which the respective caps 116 and 132 are attached) at any location that aligns with the cooling channels and/or the manifolds.

Figure 7A:
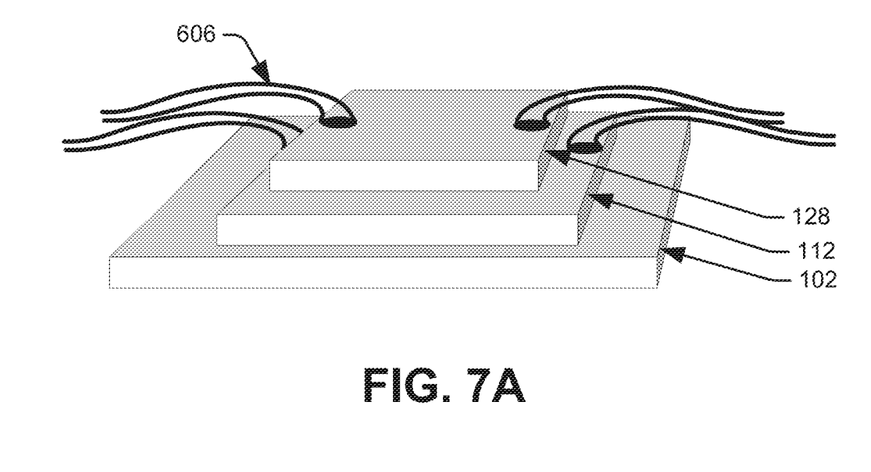
FIGS. 7A-7C present high-level 3D views of example arrangements for stacking and connecting chips comprising embedded coolant channels in accordance with one or more embodiments described herein.
Figure 7B:
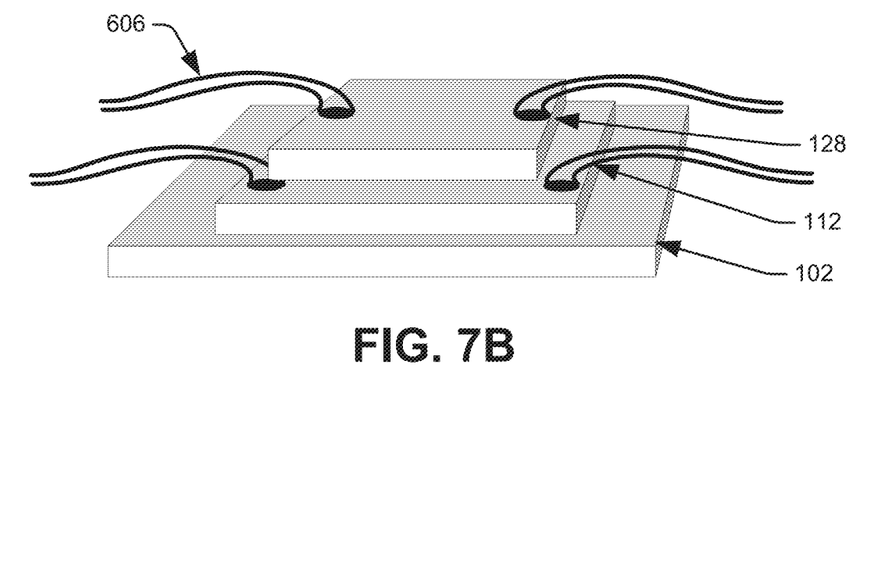
Figure 7C:
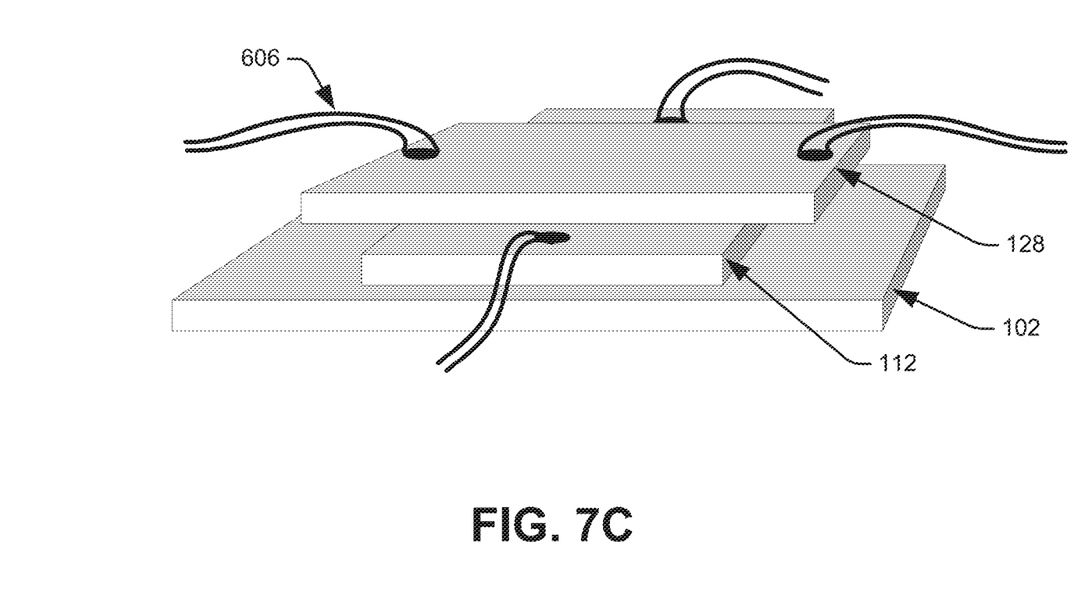

For example, FIGS. 7A-7C present high-level, 3D views of example arrangements for stacking and connecting chips comprising embedded coolant channels in accordance with one or more embodiments described herein. The respective views demonstrate example arrangements for stacking chip 112 on substrate 102 and chip 128 on chip 112 in accordance with one or more embodiments described herein. Various features and components of the 3D microelectronic chip packages discussed herein are excluded in FIGS. 7A-7C for ease of explanation. For example, although the internal components of the respective chips (e.g., the cooling channels, the TSVs, the passivation layers, etc.), the caps, the connection plates, the interconnections, the stiffener element, the lid, etc., are not shown, it should be appreciated that these elements and components can be included in the chip stacks in accordance with the embodiments described infra. Repetitive description of like elements employed in respective embodiments is omitted for sake of brevity.

FIG. 7A presents an example embodiment in which the fluidic connections and respective microfluidic tubes 606 for the chips are stacked and connected in parallel. For example, in the embodiment shown, the inlet and outlet microfluidic tubes connected to chip 128 are located on opposite sides of the chip 128 at a central cross-section of the chip. Likewise, the inlet and outlet microfluidic tubes connected to chip 112 are located in-line with the inlet and outlet microfluidic tubes of chip 128. In this regard, the respective inlet and outlet holes and hose barbs of chip 112 are in-line with those of chip 128.

FIG. 7B presents an example embodiment in which the fluidic connections and respective microfluidic tubes 606 for the chips are stacked and connected in series. For example, in the embodiment shown, the inlet and outlet microfluidic tubes connected to chip 128 are located on opposite sides of the chip 128 at a central cross-section of the chip. However, the inlet and outlet microfluidic tubes connected to chip 112 are located offset to the inlet and outlet microfluidic tubes of chip 128. In this regard, the respective inlet holes and hose barbs of chip 112 are offset relative to those of chip 128.

FIG. 7C presents an example embodiment in which the respective chips are positioned over one another with alternating orientations relative to the orientations of the internal coolant channels. For example, in the embodiment shown, both chip 128 and chip 112 include microfluidic tubes 606 connected thereto on opposite sides of the chip at central positions. To facilitate providing space for the microfluidic tubes located between stacked chips, the respective chips can be stacked with orientations that are rotated 90 degrees relative to one another. As a result, the microfluid tubes of chips 128 can be positioned at 90 degree angles relative to the microfluidic tubes of chip 112.

Figure 8:
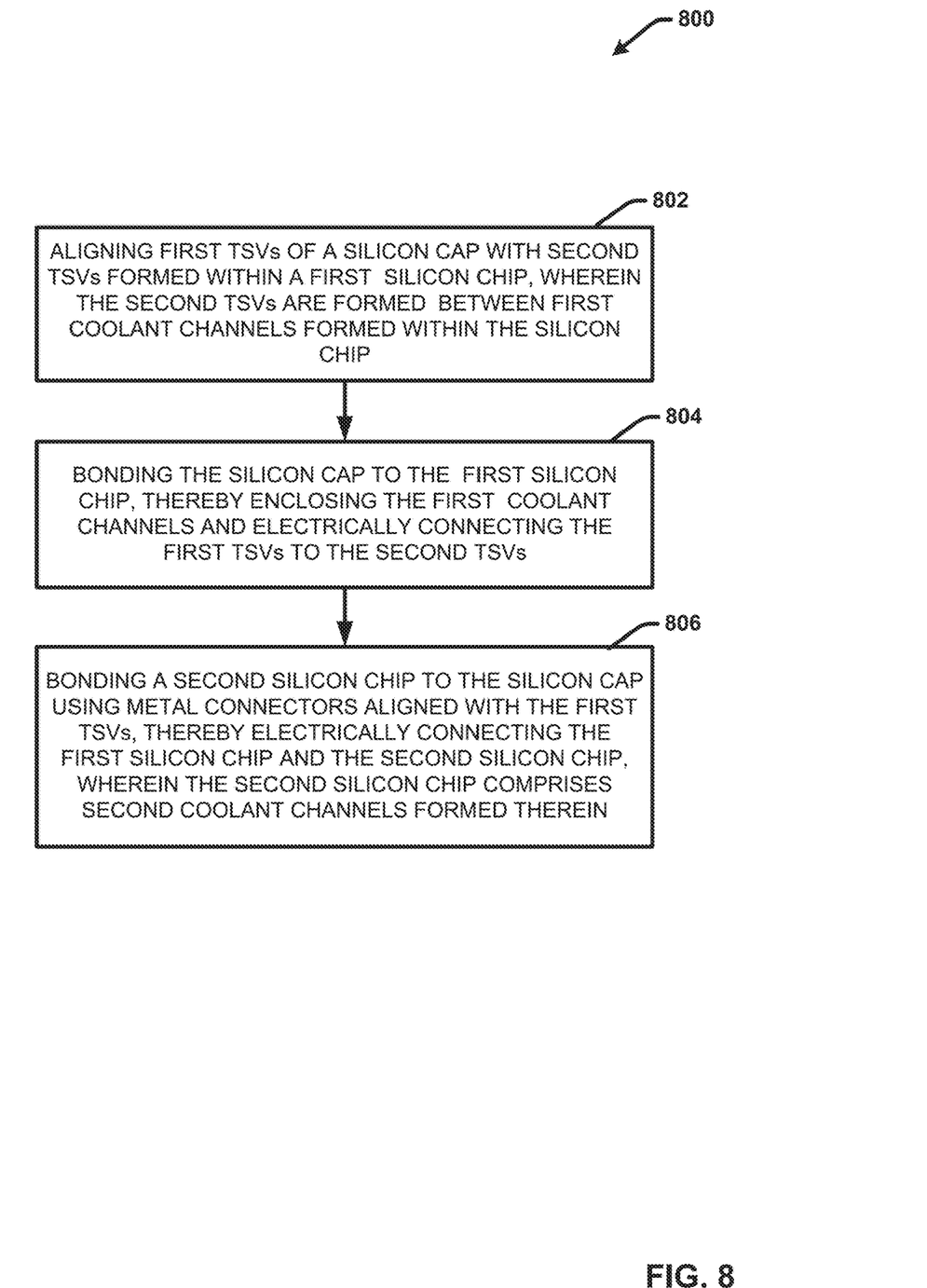
FIG. 8 presents a high-level flow diagram of an example method for forming a 3D chip stack with coolant channels while maintaining the electrical connection through the chip stack in accordance with one or more embodiments described herein.

FIG. 8 presents a high-level flow diagram of an example method for forming a 3D chip stack with coolant channels while maintaining the electrical connection through the chip stack in accordance with one or more embodiments described herein.

At 802, first TSVs of a silicon cap can be aligned with second TSVs formed within a first silicon chip, wherein the second TSVs are formed between first coolant channels formed within the first silicon chip. At 804, the silicon cap can be bonded to the first silicon chip, thereby enclosing the first coolant channels and electrically connecting the first TSVs to the second TSVs. At 806, a second silicon chip can be bonded to the first silicon cap using metal connectors (e.g., solders, C4 solders, etc.) aligned with the first TSVs, thereby electrically connecting the first silicon chip and the second silicon chip, wherein the second silicon chip comprises second coolant channels formed therein.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A microelectronic package, comprising:
   a first silicon chip comprising first coolant channels interspersed between first thru-silicon-vias;
   a silicon cap attached to a first surface of the first silicon chip, the silicon cap comprising second thru-silicon-vias that connect to the first thru-silicon-vias, wherein the silicon cap comprises a first silicon cap and wherein the microelectronic package further comprises:
   a second silicon cap bonded to a second surface of a second silicon chip opposite the first surface of the second silicon cap, wherein the first silicon cap and the second silicon cap comprise inlet holes and outlet holes respectively located outside a perimeter of the first silicon chip and the second silicon chip.

2. The microelectronic package of claim 1, further comprising:
   interconnects formed between a first surface of the second silicon chip and the silicon cap, wherein the interconnects connect to the second thru-silicon-vias and electrical components of the second silicon chip.

3. The microelectronic package of claim 1, further comprising:
   a manifold formed within the first silicon chip on opposite sides of the first coolant channels that connects to the first coolant channels.

4. The microelectronic package of claim 3, further comprising:
   inlet holes and outlet holes formed through the silicon cap that respectively connect to the manifold and provide for introducing coolant fluid into the first coolant channels and removing the coolant fluid from the first coolant channels.

5. The microelectronic package of claim 4, further comprising:
   fluid couplings that connect to the inlet holes and the outlet holes via a metal plate formed adjacent to the inlet holes and outlet holes with gaskets formed between the metal plate and the silicon cap.

6. The microelectronic package of claim 1, further comprising:
   a substrate, wherein the first silicon chip is attached to the substrate via a second surface opposite the first surface, and wherein the substrate comprises a material selected from a group consisting of ceramic and one or more laminated dielectric films.

7. The microelectronic package of claim 6, further comprising:
   a stiffener element or a lid attached to a portion of the substrate around the first silicon chip.

8. The microelectronic package of claim 6, further comprising:
   interconnects formed between the substrate and the second surface of the silicon chip.

9. The microelectronic package of claim 8, further comprising:
   redistribution layers located between the first thru-silicon-vias and the interconnects, wherein the redistribution layers respectively connect the second interconnects to the first thru-silicon-vias.

10. The microelectronic package of claim 9, wherein the redistribution layers respectively connect the second interconnects to the first thru-silicon-vias.

11. The microelectronic package of claim 1, further comprising:
    inlet fluid couplings and outlet fluidic couplings that respectively connect to the inlet and outlet holes via metal plates formed adjacent to the inlet and outlet holes with gaskets respectively formed between the metal plates and respective surfaces of the first silicon cap and the second silicon cap.

12. The microelectronic package of claim 11, wherein the inlet fluidic couplings are connected to the inlet holes in parallel or in series, and wherein the outlet fluidic couplings are connected to the outlet holes in parallel or in series.

13. The microelectronic package of claim 1, wherein the second silicon chip further comprises third thru-silicon-vias interspersed between the second coolant channels.

14. The microelectronic package of claim 13, wherein the second silicon cap further comprises fourth thru-silicon-vias that connect to the third thru-silicon-vias.

15. A microelectronic package, comprising:
    silicon chips connected to one another, wherein inlet holes and outlet holes respectively located outside a perimeter of the silicon chips, and wherein the inlet holes and outlet holes respectively provide for flowing coolant fluid through coolant channels; and
    at least one capping layer formed connected to and above the coolant channels and between adjacent silicon chips of stacked silicon chips.

16. The microelectronic package of claim 15, wherein the silicon chips comprise three of more silicon chips.

17. The microelectronic package of claim 15, the capping layer comprising second thru-silicon-vias that connect to the first thru-silicon-vias of the adjacent silicon chips.

18. The microelectronic package of claim 15, further comprising:
- inlet hose barbs connected to the inlet holes and outlet hose barbs connected to the outlet holes, wherein the inlet hose barbs are connected to the inlet holes in parallel or in series, and wherein the outlet hose barbs are connected to the outlet holes in parallel or in series.

19. A microelectronic package, comprising:
- silicon chips electrically connected to one another, wherein the silicon chips comprise coolant channels, and wherein at least one silicon chip of the silicon chips comprises first thru-silicon-vias interspersed between a first set of the coolant channels formed within the at least one silicon chip;
- capping layers formed on first surfaces of the silicon chips and enclosing formed above and connected to the coolant channels, wherein inlet holes and outlet holes respectively located outside a perimeter of the silicon chips.

20. The microelectronic package of claim 19, wherein the silicon chips comprise three or more silicon chips.

\* \* \* \* \*